(12) United States Patent
Chen et al.

(10) Patent No.: US 12,283,557 B2
(45) Date of Patent: Apr. 22, 2025

(54) INTEGRATED CIRCUIT STRUCTURE

(71) Applicant: UNITED MICROELECTRONICS CORP., Hsin-Chu (TW)

(72) Inventors: Aaron Chen, Singapore (SG); Chi Ren, Singapore (SG); Yi Hsin Liu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/398,204

(22) Filed: Dec. 28, 2023

(65) Prior Publication Data

US 2024/0128214 A1   Apr. 18, 2024

Related U.S. Application Data

(63) Continuation of application No. 17/160,400, filed on Jan. 28, 2021, now Pat. No. 11,901,318.

(30) Foreign Application Priority Data

Jan. 12, 2021 (CN) .......................... 202110034672.4

(51) Int. Cl.
| | |
|---|---|
| H01L 23/48 | (2006.01) |
| H01L 23/00 | (2006.01) |
| H01L 23/522 | (2006.01) |
| H01L 23/532 | (2006.01) |

(52) U.S. Cl.
CPC .......... H01L 24/05 (2013.01); H01L 23/5226 (2013.01); H01L 24/03 (2013.01); *H01L 23/53228* (2013.01); *H01L 23/53257* (2013.01); *H01L 2224/02313* (2013.01); *H01L 2224/0235* (2013.01); *H01L 2224/02372* (2013.01); *H01L 2224/02375* (2013.01); *H01L 2224/02381* (2013.01); *H01L 2224/0239* (2013.01); *H01L 2224/024* (2013.01); *H01L 2224/0391* (2013.01); *H01L 2224/05546* (2013.01); *H01L 2224/05624* (2013.01); *H01L 2924/1438* (2013.01); *H01L 2924/14511* (2013.01)

(58) Field of Classification Search
CPC ................................. H01L 2224/02313–05624
See application file for complete search history.

(56) References Cited

U.S. PATENT DOCUMENTS

| | | | |
|---|---|---|---|
| 11,901,318 B2 * | 2/2024 | Chen | H01L 24/03 |
| 2013/0043598 A1 | 2/2013 | Chen | |
| 2015/0001658 A1 * | 1/2015 | Wu | H01L 24/05 |
| | | | 257/432 |
| 2020/0126920 A1 | 4/2020 | Huang | |
| 2020/0343464 A1 | 10/2020 | Jongman | |

(Continued)

FOREIGN PATENT DOCUMENTS

JP      5366886      12/2013

*Primary Examiner* — Hoa B Trinh
(74) *Attorney, Agent, or Firm* — Winston Hsu

(57) ABSTRACT

An integrated circuit structure includes an aluminum pad layer on a dielectric stack, a passivation layer covering the aluminum pad layer, and an aluminum shield layer including aluminum routing patterns disposed directly above an embedded memory area and embedded in the dielectric stack. The aluminum shield layer is electrically connected to the uppermost copper layer through a plurality of tungsten vias. The plurality of tungsten vias is embedded in the dielectric stack.

10 Claims, 5 Drawing Sheets

(56) References Cited

U.S. PATENT DOCUMENTS

2021/0407950 A1 12/2021 Kurihara
2022/0068864 A1 3/2022 Kuo
2022/0077095 A1 3/2022 Kim

* cited by examiner

INTEGRATED CIRCUIT STRUCTURE

CROSS REFERENCE TO RELATED APPLICATIONS

This application is a continuation application of U.S. application Ser. No. 17/160,400, filed on Jan. 28, 2021. The content of the application is incorporated herein by reference.

BACKGROUND OF THE INVENTION

1. Field of the Invention

The present invention relates to the field of semiconductor technology, in particular to an integrated circuit (IC) structure with a shield layer.

2. Description of the Prior Art

An integrated circuit (IC) chip usually includes multilayer (for example, 3-12 layers) metal interconnection structures, which are disposed on a substrate, for example, a silicon substrate. These metal interconnect structures such as copper damascene interconnect structures may be high-density metal patterns fabricated with deep sub-micron (for example, less than 100 nm) design rules. Bonding pads or a redistribution layer to fan out input/output (I/O) terminals, which are made of a single aluminum metal layer, may be provided over the copper damascene interconnect structure.

IC chips may be subject to various security attacks, in which unauthorized parties try to intercept confidential information processed or stored in the IC chips. Typically, in order to protect the IC chip and prevent the attack on the IC chip, a shield layer is provided in the pad layer made of aluminum metal. However, with the development of high-performance computing chips and artificial intelligence (AI) chips, in order to increase the bandwidth, the result is that the number of I/O terminals on the IC chip has increased significantly. Therefore, it becomes very difficult to simultaneously fabricate the shield layer and the bonding pads on a single aluminum metal layer.

SUMMARY OF THE INVENTION

It is one object of the present invention to provide an improved integrated circuit structure in order to solve the above-mentioned shortcomings or deficiencies of the prior art.

One aspect of the invention provides an integrated circuit structure including a substrate comprising thereon a logic core circuit region and an embedded memory area; a copper interconnect structure disposed on the substrate, wherein the copper interconnect structure comprises an uppermost copper layer covered by a dielectric stack comprising a silicon nitride cap layer, a lower dielectric layer on the silicon nitride cap layer, and an upper dielectric layer on the lower dielectric layer; an aluminum pad layer disposed on the dielectric stack, wherein the aluminum pad layer comprises a first pad pattern within the logic core circuit region and a second pad pattern within the embedded memory area; a passivation layer covering the first pad pattern within the logic core circuit region and the second pad pattern within the embedded memory area; and an aluminum shield layer comprising aluminum routing patterns disposed directly above the embedded memory area and embedded between the lower dielectric layer and the upper dielectric layer, wherein the aluminum shield layer is electrically connected to the uppermost copper layer through a plurality of tungsten vias, wherein the plurality of tungsten vias is embedded in the lower dielectric layer and the silicon nitride cap layer.

According to some embodiments, the first pad pattern and the second pad pattern respectively contact the uppermost copper layer and the aluminum shield layer at different horizontal levels.

According to some embodiments, the aluminum shield layer has a thickness that is thinner than that of the aluminum pad layer.

According to some embodiments, the upper dielectric layer covers the aluminum shield layer and is in direct contact with a sidewall and a top surface of the aluminum shield layer.

According to some embodiments, each of the plurality of tungsten vias has a width of about 0.3-0.8 micrometers.

According to some embodiments, the aluminum shield layer has a line width of about 0.5-2 micrometers and a space between adjacent two of the aluminum routing patterns of about 0.5-2 micrometers.

According to some embodiments, a top surface of the plurality of tungsten vias is coplanar with a top surface of the lower dielectric layer.

According to some embodiments, the lower dielectric layer comprises silicon oxide.

According to some embodiments, the aluminum pad layer is electrically connected to the metal layer through an aluminum via.

According to some embodiments, the passivation layer comprises a phosphorus silicate glass (PSG) layer and a silicon nitride layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
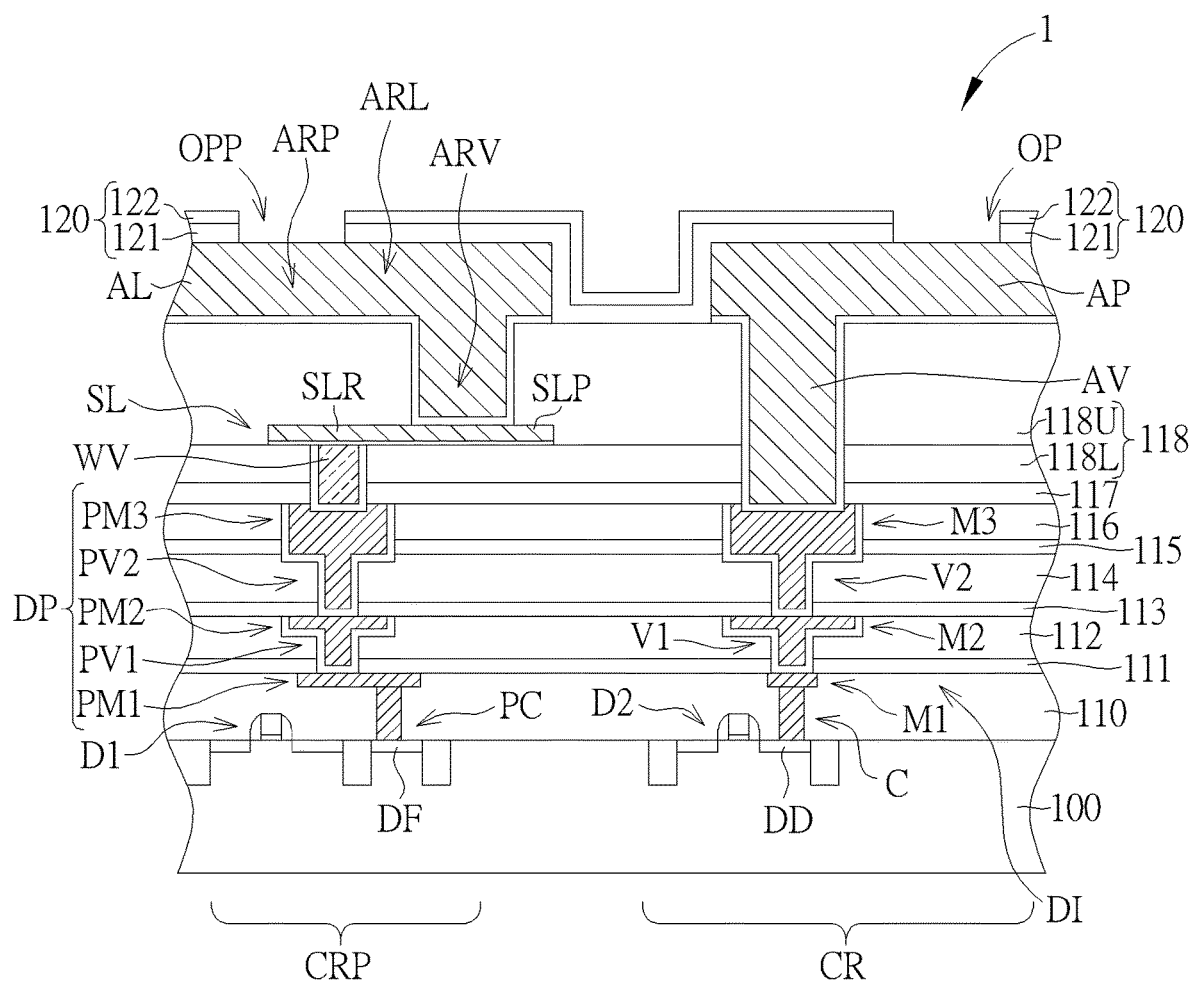
FIG. 1 is a partial cross-sectional view of an integrated circuit structure according to an embodiment of the invention.

Please refer to FIG. 1, which is a partial cross-sectional view of an integrated circuit structure according to an embodiment of the present invention. As shown in FIG. 1, the integrated circuit structure 1 of the present invention includes a substrate 100, such as a silicon substrate. A circuit region CRP and a circuit region CR may be disposed on the substrate 100. According to an embodiment of the present invention, the circuit region CRP may be a circuit area that stores confidential information and needs to be protected, such as an embedded memory area, but is not limited to this. According to an embodiment of the present invention, for example, the circuit region CR may be a logic core circuit region or other functional circuit blocks, but is not limited thereto.

According to an embodiment of the present invention, at least one circuit element D1 and at least one circuit element D2 may be formed on the substrate 100 in the circuit region CRP and in the circuit region CR, respectively. According to an embodiment of the present invention, for example, the circuit element D1 may be an embedded flash memory cell, and the circuit element D2 may be a field effect transistor, but is not limited thereto. Those skilled in the art should understand that the number and structure of the circuit element D1 and the circuit element D2 in FIG. 1 are merely illustrative.

According to an embodiment of the present invention, a plurality of dielectric layers 110-118 are further provided on the substrate 100, for example, silicon oxide, silicon nitride, or low-k material layers. For example, the dielectric layer 110 may be a silicon oxide layer, the dielectric layers 111 and 113 may be carbon-doped silicon nitride (SiCN) layers, and the dielectric layer 112 may be a fluorosilicate glass (FSG) layer. The dielectric layers 114 and 116 may be silicon oxide layers, and the dielectric layers 115 and 117 may be silicon nitride layers, but are not limited thereto.

According to an embodiment of the present invention, at least one copper interconnect structure DP is formed in the plurality of dielectric layers 110-118 in the circuit region CRP. According to an embodiment of the present invention, for example, the copper interconnect structure DP may include copper metal layers PM1, PM2, and PM3. The copper metal layer PM1 may be electrically connected to the conductive area DF on the substrate 100 through the contact plug PC. The copper metal layer PM2 may be electrically connected to the copper metal layer PM1 through the copper metal via PV1. The copper metal layer PM3 may be electrically connected to the copper metal layer PM2 through the copper metal via PV2. Those skilled in the art should understand that the number and structure of the metal layers of the copper interconnect structure DP in FIG. 1 are merely illustrative.

According to an embodiment of the present invention, the copper metal layer PM1 and the contact plug PC may be formed in the dielectric layer 110, the copper metal layer PM2 and the copper metal via PV1 may be formed in the dielectric layers 111 and 112, and the copper metal layer PM3 and the copper metal via PV2 may be formed in the dielectric layers 113-116. According to an embodiment of the present invention, the copper interconnect structure DP can be formed through a copper damascene process. Since the copper damascene process is a well-known technology, the details thereof will not be repeated. In this embodiment, the copper metal layer PM3 is the uppermost copper layer of the copper interconnect structure DP. After the chemical mechanical polishing (CMP) of the copper metal layer PM3 is completed, the dielectric layer 117 is deposited to cover the copper surface of the copper metal layer PM3 to avoid oxidation.

Similarly, at least one copper interconnect structure DI may be formed in the plurality of dielectric layers 110-118 in the circuit region CR. According to an embodiment of the present invention, for example, the copper interconnect structure DI may include copper metal layers M1, M2, and M3. The copper metal layer M1 may be electrically connected to the doped region DD on the substrate 100 through the contact plug C. The copper metal layer M2 may be electrically connected to the copper metal layer M1 through the copper metal via V1. The copper metal layer M3 may be electrically connected to the copper metal layer M2 through the copper metal via V2.

According to an embodiment of the present invention, the uppermost copper layer PM3 of the copper interconnect structure DP and the uppermost copper layer M3 of the copper interconnect structure DI, are covered by the dielectric layer 118.

According to an embodiment of the present invention, the dielectric layer 118 may include a silicon oxide layer. According to an embodiment of the present invention, the dielectric layer 118 may include a lower dielectric layer 118L and an upper dielectric layer 118U. According to an embodiment of the present invention, the upper dielectric layer 118U and the lower dielectric layer 118L may be composed of the same dielectric material. According to an embodiment of the present invention, for example, both the upper dielectric layer 118U and the lower dielectric layer 118L include silicon oxide. In other embodiments, the upper dielectric layer 118U and the lower dielectric layer 118L may be composed of different dielectric materials. According to an embodiment of the present invention, the upper dielectric layer 118U is thicker than the lower dielectric layer 118L.

According to an embodiment of the present invention, an aluminum pad layer AL is provided on the dielectric layer 118. For example, the aluminum pad layer AL may include a pad pattern AP in the circuit region CR, which is electrically connected to the copper metal layer M3 through an aluminum via AV formed in the dielectric layer 118 and the dielectric layer 117. For example, the aluminum pad layer AL may include a pad pattern ARP and a redistribution layer ARL in the circuit region CRP, and the aluminum pad layer AL is electrically connected to an aluminum shield layer SL through an aluminum via ARV formed in the upper dielectric layer 118U. According to an embodiment of the present invention, the aluminum shield layer SL is disposed directly above the circuit region CRP and between the uppermost copper layer PM3 and the aluminum pad layer AL to protect the circuit region CRP. According to an embodiment of the present invention, the aluminum shield layer SL may include at least one aluminum routing pattern SLR and at least one aluminum pad SLP, and the aluminum via ARV is directly provided on the aluminum pad SLP.

Figure 2:
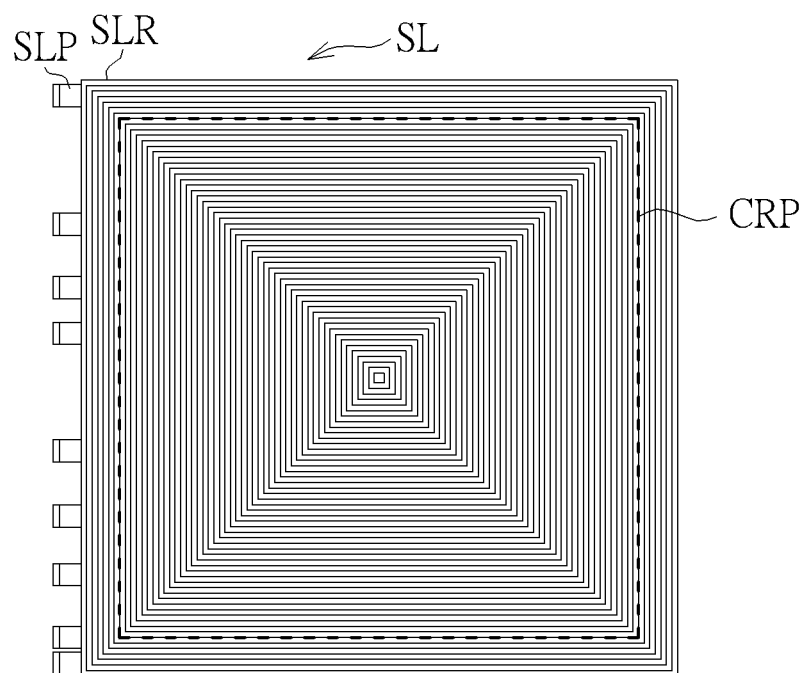
FIG. 2 illustrates a top view of the aluminum shield layer.

FIG. 2 illustrates a top view of the aluminum shield layer SL. According to an embodiment of the present invention, as shown in FIG. 2, the aluminum shield layer SL may be composed of a plurality of concentric aluminum routing patterns SLR, which may overlap with the circuit region CRP, but is not limited thereto. The layout of the aluminum routing patterns SLR can be determined according to actual design requirements. Those skilled in the art should understand that the number and layout of the aluminum routing patterns SLR in FIG. 2 are merely illustrative. As shown in FIG. 2, for example, the aluminum pad SLP used to be electrically connected to the aluminum via ARV may be provided on the same side of the aluminum shield layer SL, but it is not limited thereto.

According to an embodiment of the present invention, as shown in FIG. 1, the integrated circuit structure 1 may further include a passivation layer 120 that partially covers the aluminum pad layer AL and partially covers the dielectric layer 118. According to an embodiment of the present invention, the passivation layer 120 may include a phosphorus silicate glass (PSG) layer 121 and a silicon nitride layer 122, but is not limited thereto. The passivation layer 120 may include an opening OP to expose a part of the pad pattern AP, and include an opening OPP to expose a part of the pad pattern ARP.

According to an embodiment of the present invention, as shown in FIG. 1, the aluminum routing pattern SLR of the aluminum shield layer SL may be electrically connected to the uppermost copper layer PM3 through at least one tungsten via WV. According to an embodiment of the present invention, the tungsten via WV is provided in the lower dielectric layer 118L. The hole filling capability or step coverage capability of the aluminum metal process is poor due to the small size of the via hole connecting the aluminum routing pattern SLR and the uppermost copper layer PM3, so that the present invention utilizes a tungsten via to electrically connect the aluminum routing pattern SLR with the uppermost copper layer PM3 in order to avoid the defects caused by using the aluminum metal process to fill such a small via hole.

Figure 3:
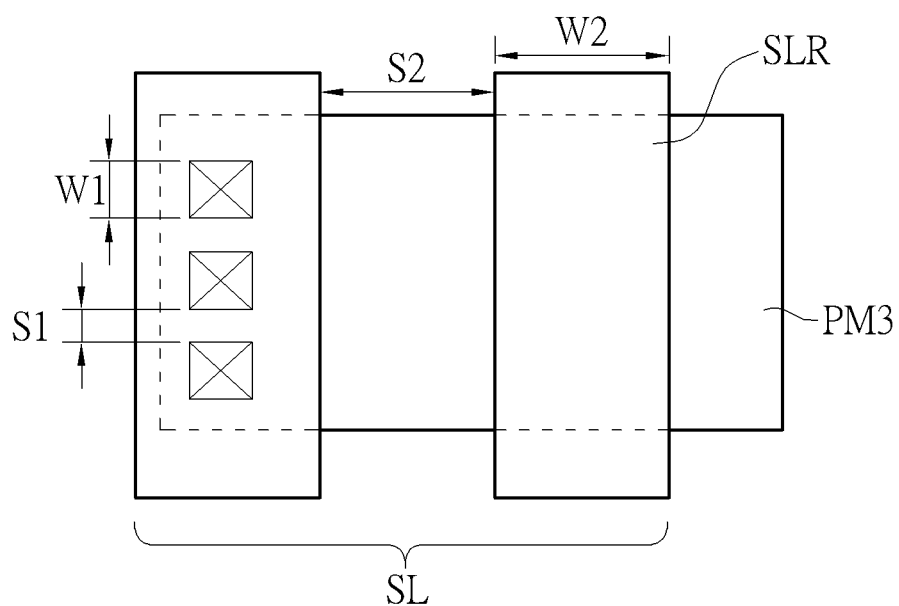
FIG. 3 illustrates the partial layout and related dimensions of the tungsten via, the aluminum routing pattern, and the uppermost copper layer.

FIG. 3 illustrates the partial layout and related dimensions of the tungsten via WV, the aluminum routing pattern SLR, and the uppermost copper layer PM3. According to an embodiment of the present invention, as shown in FIG. 3, the width W1 of the tungsten vias WV is about 0.3-0.8 micrometers, and the distance S1 between the tungsten vias WV is about 0.7-1.5 micrometers. In addition, the width (line width) W2 of the aluminum routing pattern SLR is about 0.5-2 micrometers, and the distance S2 between the aluminum routing patterns SLR is about 0.5-2 micrometers.

Figure 4:
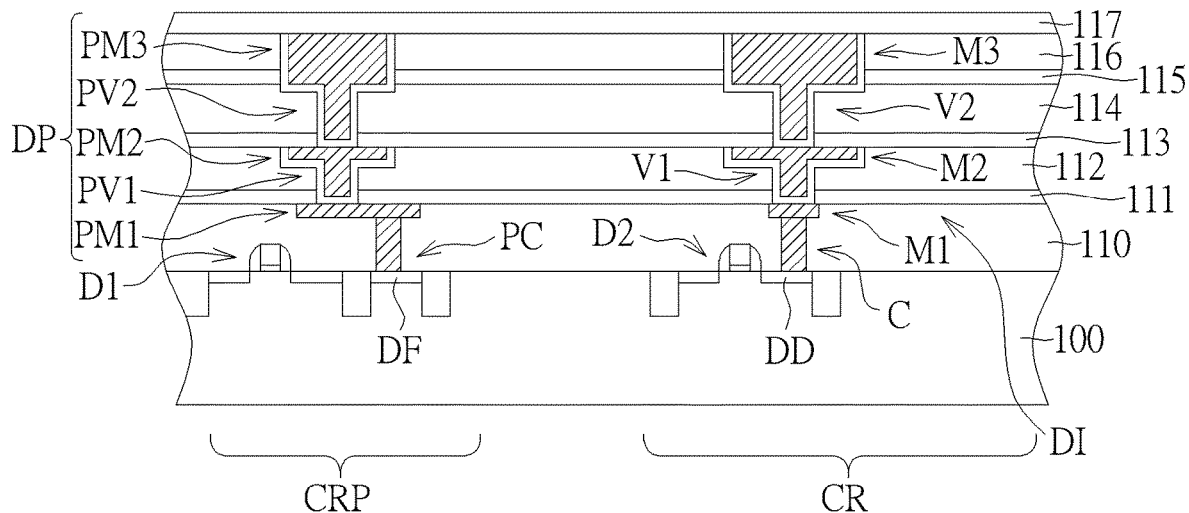
FIG. 4 to FIG. 7 are schematic diagrams showing a method for forming an integrated circuit structure according to an embodiment of the present invention.

Please refer to FIG. 4 to FIG. 7, which are schematic diagrams showing the method of forming an integrated circuit structure according to an embodiment of the present invention, wherein like regions, layers or components are designated by like numeral numbers or labels. As shown in FIG. 4, a substrate 100 is first provided, which includes a circuit region CRP and a circuit region CR. Next, a copper interconnect structure DP and a copper interconnect structure DI are respectively formed on the substrate 100 in the circuit region CRP and the circuit region CR. The copper interconnect structure DP includes the uppermost copper layer PM3 covered by the dielectric layer 117, and the copper interconnect structure DI includes the uppermost copper layer M3 covered by the dielectric layer 117. Those skilled in the art should understand that the number and structure of the metal layers of the copper interconnect structures DP and DI in FIG. 4 are merely illustrative.

According to an embodiment of the present invention, a plurality of dielectric layers 110-118, such as silicon oxide, silicon nitride, or low dielectric constant (low-k) material layers, may be sequentially deposited on the substrate 100 by using a chemical vapor deposition (CVD) process. For example, the dielectric layer 110 may be a silicon oxide layer, the dielectric layers 111 and 113 may be carbon-doped silicon nitride layers, the dielectric layer 112 may be a FSG layer, the dielectric layers 114 and 116 may be silicon oxide layer, and the dielectric layers 115 and 117 may be silicon nitride layers, but are not limited thereto.

According to an embodiment of the present invention, the copper interconnect structure DP is formed in the plurality of dielectric layers 110-118 in the circuit region CRP. According to an embodiment of the present invention, for example, the copper interconnect structure DP may include copper metal layers PM1, PM2, and PM3. The copper metal layer PM1 may be electrically connected to the conductive area DF on the substrate 100 through the contact plug PC. The copper metal layer PM2 may be electrically connected to the copper metal layer PM1 through the copper metal via PV1. The copper metal layer PM3 may be electrically connected to the copper metal layer PM2 through the copper metal via PV2.

According to an embodiment of the present invention, the copper metal layer PM1 and the contact plug PC may be formed in the dielectric layer 110, the copper metal layer PM2 and the copper metal via PV1 may be formed in the dielectric layers 111 and 112, and the copper metal layer PM3 and the copper metal via PV2 may be formed in the dielectric layers 113-116. According to an embodiment of the present invention, the copper interconnect structure DP may be formed through a copper damascene process. Since the copper damascene process is a well-known technology, the details thereof will not be repeated. In this embodiment, after the chemical mechanical polishing of the copper metal layer PM3 is completed, the dielectric layer 117 is deposited to cover the copper surface of the copper metal layer PM3 to avoid oxidation.

Figure 5:
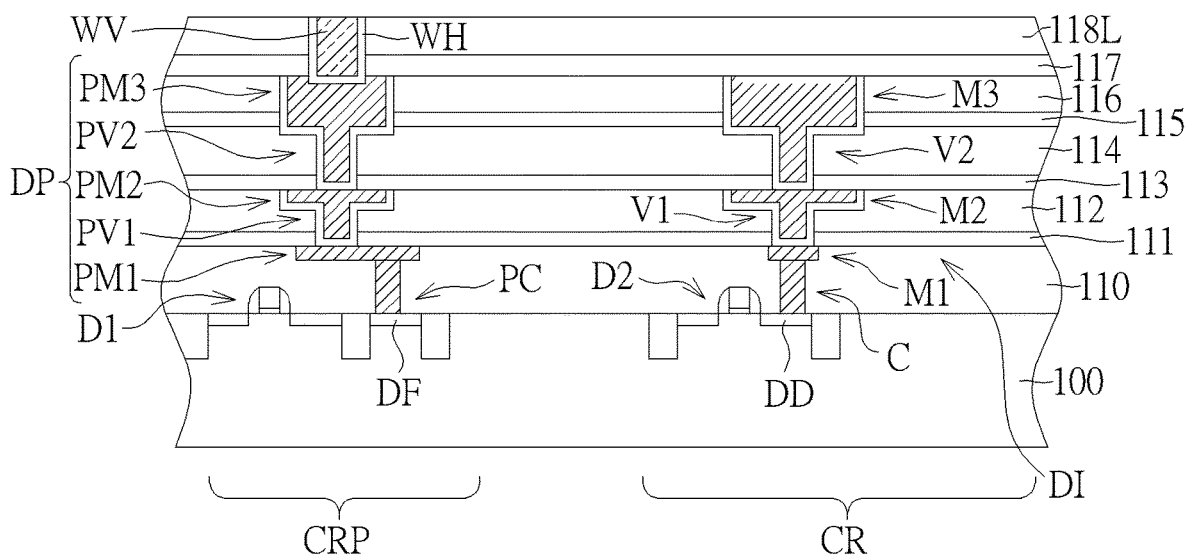

As shown in FIG. 5, a CVD process can then be performed to deposit a lower dielectric layer 118L, for example, a silicon oxide layer, on the surface of the dielectric layer 117. Next, a lithographic process and an etching process may be performed to form at least one through hole WH in the lower dielectric layer 118L in the circuit region CRP, and then a tungsten deposition process is performed, for example, by using a CVD method, to fill the through hole WH with a tungsten metal layer. A chemical mechanical polishing (CMP) process is then performed to polish away the excess tungsten metal layer outside the through hole WH, so that a tungsten via WV is formed in the lower dielectric layer 118L. According to an embodiment of the present invention, the width of the tungsten via WV is about 0.3-0.8 micrometers.

Figure 6:
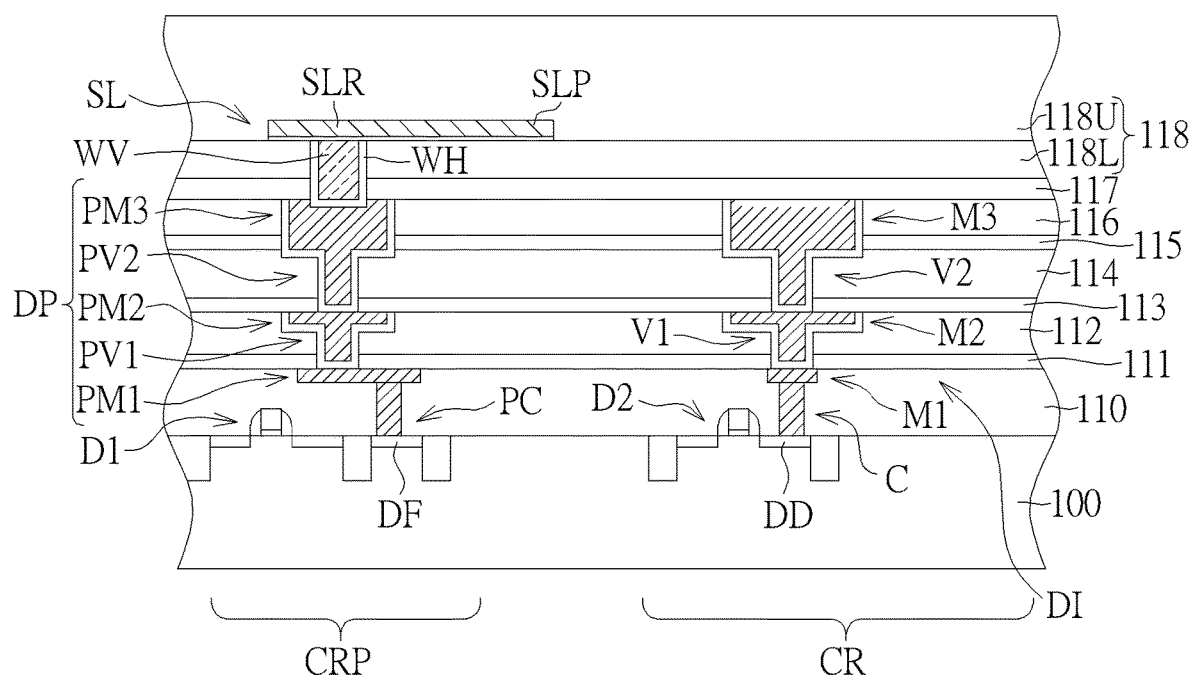

As shown in FIG. 6, an aluminum deposition process is then performed, and an aluminum metal layer is deposited on the lower dielectric layer 118L and the tungsten via WV in a blanket manner According to an embodiment of the present invention, for example, the thickness of the aluminum metal layer may be between 0.3 and 0.7 micrometers, but is not limited thereto. Then, a lithographic process and an etching process may be performed to pattern the aluminum metal layer to form an aluminum shield layer SL. According to an embodiment of the present invention, the aluminum shield layer SL is disposed directly above the circuit region CRP to protect the circuit region CRP. According to an embodiment of the present invention, the aluminum shield layer SL may include at least one aluminum routing pattern SLR and at least one aluminum pad SLP. According to an embodiment of the present invention, the aluminum shield layer SL is electrically connected to the uppermost copper layer PM3 through the tungsten via WV. Next, an upper dielectric layer 118U is deposited on the aluminum shield layer SL and the lower dielectric layer 118L. According to an embodiment of the present invention, the upper dielectric layer 118U is thicker than the lower dielectric layer 118L. According to an embodiment of the present invention, the upper dielectric layer 118U and the lower dielectric layer 118L may be composed of the same dielectric material.

Figure 7:
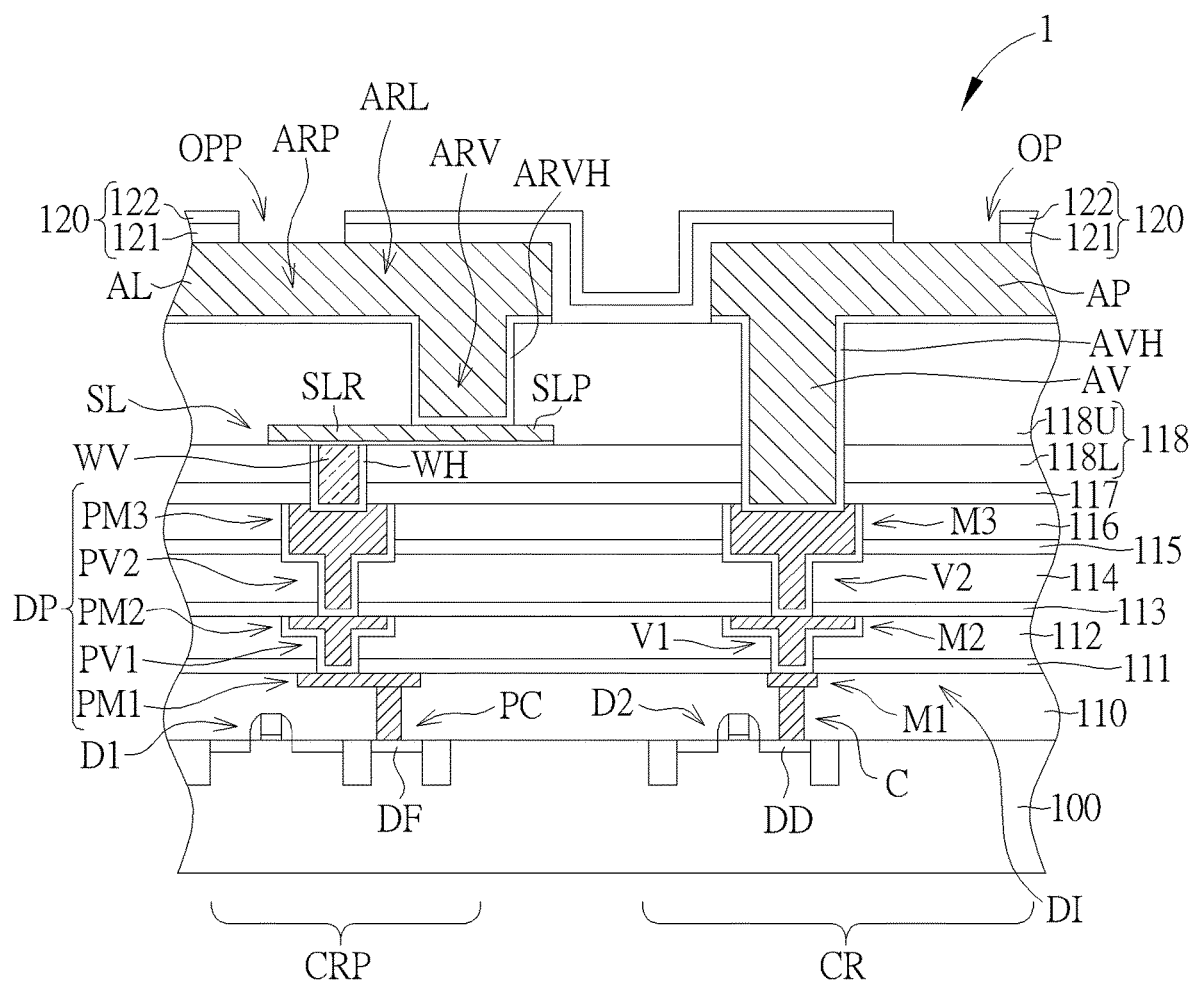

As shown in FIG. 7, a lithographic process and an etching processes may be performed to form a through hole ARVH and a through hole AVH in the dielectric layer 118 in the circuit region CRP and the circuit region CR, respectively. The through hole ARVH is only formed in the upper dielectric layer 118U. The through hole AVH penetrates the upper dielectric layer 118U, the lower dielectric layer 118L and the dielectric layer 117. According to an embodiment of the present invention, the through hole ARVH and the through hole AVH respectively expose part of the aluminum pad SLP and part of the copper metal layer M3. Next, an aluminum deposition process is performed to form an aluminum metal layer in the through hole ARVH and through hole AVH and on the dielectric layer 118. The thickness of the aluminum metal layer is greater than that of the aluminum shield layer SL. The aluminum metal is then patterned by a lithographic process and an etching process, thereby forming an aluminum pad layer AL. For example, the aluminum pad layer AL may include the pad pattern AP in the circuit region CR, which is electrically connected to the copper metal layer M3 through the aluminum via AV formed in the dielectric layer 118 and the dielectric layer 117. The aluminum pad layer AL may include a pad pattern ARP and a redistribution layer ARL in the circuit region CRP, and the aluminum pad layer AL is electrically connected to the aluminum shield layer SL via an aluminum via ARV formed in the upper dielectric layer 118U.

According to an embodiment of the present invention, the passivation layer 120 is deposited. The passivation layer 120 partially covers the aluminum pad layer AL and partially covers the dielectric layer 118. According to an embodiment of the present invention, the passivation layer 120 may include a PSG layer 121 and a silicon nitride layer 122, but is not limited thereto. The passivation layer 120 may include an opening OP to expose a part of the pad pattern AP, and include an opening OPP to expose a part of the pad pattern ARP.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit structure, comprising:
    a substrate comprising thereon a logic core circuit region and an embedded memory area;
    a copper interconnect structure disposed on the substrate, wherein the copper interconnect structure comprises an uppermost copper layer covered by a dielectric stack comprising a silicon nitride cap layer, a lower dielectric layer on the silicon nitride cap layer, and an upper dielectric layer on the lower dielectric layer;
    an aluminum pad layer disposed on the dielectric stack, wherein the aluminum pad layer comprises a first pad pattern within the logic core circuit region and a second pad pattern within the embedded memory area;
    a passivation layer covering the first pad pattern within the logic core circuit region and the second pad pattern within the embedded memory area; and
    an aluminum shield layer comprising aluminum routing patterns disposed directly above the embedded memory area and embedded between the lower dielectric layer and the upper dielectric layer, wherein the aluminum shield layer is electrically connected to the uppermost copper layer through a plurality of tungsten vias, wherein the plurality of tungsten vias is embedded in the lower dielectric layer and the silicon nitride cap layer.

2. The integrated circuit structure according to claim 1, wherein the first pad pattern and the second pad pattern respectively contact the uppermost copper layer and the aluminum shield layer at different horizontal levels.

3. The integrated circuit structure according to claim 1, wherein the aluminum shield layer has a thickness that is thinner than that of the aluminum pad layer.

4. The integrated circuit structure according to claim 1, wherein the upper dielectric layer covers the aluminum shield layer and is in direct contact with a sidewall and a top surface of the aluminum shield layer.

5. The integrated circuit structure according to claim 1, wherein each of the plurality of tungsten vias has a width of about 0.3-0.8 micrometers.

6. The integrated circuit structure according to claim 5, wherein the aluminum shield layer has a line width of about 0.5-2 micrometers and a space between adjacent two of the aluminum routing patterns of about 0.5-2 micrometers.

7. The integrated circuit structure according to claim 1, wherein a top surface of the plurality of tungsten vias is coplanar with a top surface of the lower dielectric layer.

8. The integrated circuit structure according to claim 7, wherein the lower dielectric layer comprises silicon oxide.

9. The integrated circuit structure according to claim 1, wherein the aluminum pad layer is electrically connected to the metal layer through an aluminum via.

10. The integrated circuit structure according to claim 1, wherein the passivation layer comprises a phosphorus silicate glass (PSG) layer and a silicon nitride layer.

* * * * *